United States Patent
Dasari et al.

(10) Patent No.: US 12,079,711 B2
(45) Date of Patent: Sep. 3, 2024

(54) APPARATUS AND MECHANISM FOR PROCESSING NEURAL NETWORK TASKS USING A SINGLE CHIP PACKAGE WITH MULTIPLE IDENTICAL DIES

(71) Applicant: Google LLC, Mountain View, CA (US)

(72) Inventors: Uday Kumar Dasari, Union City, CA (US); Olivier Temam, Antony (FR); Ravi Narayanaswami, San Jose, CA (US); Dong Hyuk Woo, San Jose, CA (US)

(73) Assignee: Google LLC, Mountain View, CA (US)

( * ) Notice: Subject to any disclaimer, the term of this patent is extended or adjusted under 35 U.S.C. 154(b) by 862 days.

(21) Appl. No.: 17/186,598

(22) Filed: Feb. 26, 2021

(65) Prior Publication Data

US 2021/0256361 A1 Aug. 19, 2021

Related U.S. Application Data

(63) Continuation of application No. 15/819,753, filed on Nov. 21, 2017, now Pat. No. 10,936,942.

(51) Int. Cl.
*G06N 3/063* (2023.01)
*G06F 7/50* (2006.01)
(Continued)

(52) U.S. Cl.
CPC ......... *G06N 3/063* (2013.01); *G06F 15/7896* (2013.01); *G06N 3/04* (2013.01);
(Continued)

(58) Field of Classification Search
CPC .......... G06N 3/063; G06N 3/04; G06N 20/00; G06N 3/0464; G06F 15/7896;
(Continued)

(56) References Cited

U.S. PATENT DOCUMENTS

| 5,465,375 A | 11/1995 | Thepaut et al. |
| 5,568,574 A | 10/1996 | Tanguay et al. |

(Continued)

FOREIGN PATENT DOCUMENTS

| JP | H02-236659 | 9/1990 |
| JP | H06-012393 | 1/1994 |

(Continued)

OTHER PUBLICATIONS

Peter Kinget, et al., (NPL—"CA Programmable Analog Cellular Neural Network CMOS Chip for High Speed Image Processing" Published Mar. 1995—(pp. 235-243) (Year: 1995).*

(Continued)

*Primary Examiner* — Quoc A Tran
(74) *Attorney, Agent, or Firm* — Fish & Richardson P.C.

(57) ABSTRACT

Apparatus and methods for processing neural network models are provided. The apparatus can comprise a plurality of identical artificial intelligence processing dies. Each artificial intelligence processing die among the plurality of identical artificial intelligence processing dies can include at least one inter-die input block and at least one inter-die output block. Each artificial intelligence processing die among the plurality of identical artificial intelligence processing dies is communicatively coupled to another artificial intelligence processing die among the plurality of identical artificial intelligence processing dies by way of one or more communication paths from the at least one inter-die output block of the artificial intelligence processing die to the at least one inter-die input block of the artificial intelligence processing die. Each artificial intelligence processing die among the plurality of identical artificial intelligence processing dies corresponds to at least one layer of a neural network.

20 Claims, 9 Drawing Sheets

(51) Int. Cl.
  *G06F 13/16*    (2006.01)
  *G06F 13/40*    (2006.01)
  *G06F 15/78*    (2006.01)
  *G06F 17/16*    (2006.01)
  *G06N 3/04*     (2023.01)
  *G06N 3/0464*   (2023.01)
  *G06N 20/00*    (2019.01)
  *G11C 11/22*    (2006.01)
  *G11C 11/54*    (2006.01)
  *H01L 25/065*   (2023.01)
  *H01L 25/18*    (2023.01)

(52) U.S. Cl.
  CPC ............ *G06F 7/50* (2013.01); *G06F 13/1668* (2013.01); *G06F 13/4027* (2013.01); *G06F 17/16* (2013.01); *G06N 3/0464* (2023.01); *G06N 20/00* (2019.01); *G11C 11/22* (2013.01); *G11C 11/54* (2013.01); *H01L 25/0652* (2013.01); *H01L 25/0657* (2013.01); *H01L 25/18* (2013.01); *H01L 2225/06541* (2013.01); *H01L 2225/06589* (2013.01)

(58) Field of Classification Search
  CPC .... G06F 13/4027; G06F 7/50; G06F 13/1668; G06F 17/16; G11C 11/22; G11C 11/54; H01L 25/0657; H01L 25/0652; H01L 2225/06541; H01L 2225/06589; H01L 25/18
  See application file for complete search history.

(56) References Cited

U.S. PATENT DOCUMENTS

| | | | |
|---|---|---|---|
| 7,068,072 | B2 | 6/2006 | New et al. |
| 7,284,226 | B1 | 10/2007 | Kondapalli |
| 7,581,198 | B2 | 8/2009 | Huynh et al. |
| 9,619,748 | B1 | 4/2017 | Commons et al. |
| 9,710,265 | B1 | 7/2017 | Temam et al. |
| 10,248,908 | B2 | 4/2019 | Tennann |
| 10,360,163 | B2 | 7/2019 | Woo |
| 10,373,291 | B1 | 8/2019 | Killebrew |
| 10,417,303 | B2 | 9/2019 | Narayanaswanni |
| 10,496,326 | B2 | 12/2019 | Tennann |
| 10,504,022 | B2 | 12/2019 | Tennann |
| 10,534,578 | B1 | 1/2020 | Narayanaswanni |
| 10,534,607 | B2 | 1/2020 | Tennann |
| 10,592,583 | B2 | 3/2020 | Woo |
| 10,614,151 | B2 | 4/2020 | Woo |
| 10,706,007 | B2 | 7/2020 | Thorson |
| 10,719,575 | B2 | 7/2020 | Narayanaswanni |
| 10,802,956 | B2 | 10/2020 | Tennann |
| 2016/0379115 | A1 | 12/2016 | Burger et al. |
| 2017/0300807 | A1 | 10/2017 | Hu et al. |
| 2018/0307985 | A1* | 10/2018 | Appu ............... G06N 3/084 |
| 2023/0061670 | A1* | 3/2023 | Ould-Ahmed-Vall ............... G06N 3/084 |

FOREIGN PATENT DOCUMENTS

| | | |
|---|---|---|
| JP | H06-151694 | 5/1994 |
| JP | 2010-109111 | 5/2010 |
| JP | 2011236815 A | 11/2011 |
| JP | 5956708 | 7/2016 |

OTHER PUBLICATIONS

Cavigelli et al., "Origami a Convolutional Network Accelerator" In Proceedings of the 25th edition on Great Lakes Symposium on VLSI May 2015, 199-204.

Extended European Search Report in European Appln. No. 23182760.1, mailed on Dec. 22, 2023, 12 pages.

Office Action in Japanese Appln. No. 2022-096437, mailed on Oct. 3, 2023, 6 pages (with English translation).

Pham et al., "Neuflow: Dataflow Vision Processing System-On-a-Chip" 2012 IEEE 55th International Midwest Symposium on Circuits and Systems (MWSCAS). IEEE, Aug. 2012, 1044-1047.

International Search Report and Written Opinion issued Jan. 21, 2019 in International (PCT) Application No. PCT/US2018/052216.

KR Office Action in Korean Application No. 10-2019-7034133, dated Nov. 20, 2020, 10 pages (with English translation).

Shafiee et al., "ISAAC: A convolutional neural network accelerator with in-situ analog arithmetic in crossbars," ACM SIGARCH Computer Architecture News, Jun. 2016, 33(3):14-26.

Written Submissions s in European Appln. No. 18786508.4, dated Feb. 22, 2023, 11 pages.

IN Office Action in Indian Application No. 201947046132, dated Oct. 7, 2921 6 pages (with English translation).

IN Office Action in Indian Appln. No. 202248023009, dated Sep. 8, 2022, 5 pages (with English Translation).

EP Office Action in European Application No. 18786508.4, dated Sep. 27, 2021, 10 pages.

JP Office Action in Japanese Application No. 2019-563078, dated Aug. 17, 2021, 12 pages (with English translation).

Magaki et al, "ASIC Clouds: Specializing the Datacenter" ICPC, 2013, 13 pages.

Hua et al., "Knowledge increase ability analysis on artificial neural network," Journal of Computer Research and Development, Feb. 16, 2005, 42(2):224-229 (with English Abstract).

Office Action in Chinese Appln. No. 201880033593.8, dated Nov. 28, 2022, 21 pages (with English Translation).

\* cited by examiner

APPARATUS AND MECHANISM FOR PROCESSING NEURAL NETWORK TASKS USING A SINGLE CHIP PACKAGE WITH MULTIPLE IDENTICAL DIES

CROSS REFERENCE TO RELATED APPLICATION

This application is a continuation of U.S. application Ser. No. 15/819,753, filed Nov. 21, 2017, the contents of which are incorporated by reference herein.

BACKGROUND

Use of neural networks in the field of artificial intelligence computing has grown rapidly over the past several years. More recently, use of specific purpose computers, such as application specific integrated circuits (ASICs) have been used for processing neural networks. However, use of ASICs pose several challenges. Some of these challenges are (1) long design time, and (2) non-negligible non-recurring engineering costs. As the popularity of the neural networks rise and the range of tasks for which neural networks are used grows, the long design time and the non-negligible non-recurring engineering costs will exacerbate.

SUMMARY

At least one aspect is directed to an artificial intelligence processing unit. The artificial intelligence processing unit includes multiple identical artificial intelligence processing dies. Each artificial intelligence processing die among the multiple identical artificial intelligence processing dies includes at least one inter-die input block and at least one inter-die output block. Each artificial intelligence processing die among the multiple identical artificial intelligence processing dies is communicatively coupled to another artificial intelligence processing die among the multiple identical artificial intelligence processing dies by way of one or more communication paths from the at least one inter-die output block of the artificial intelligence processing die to the at least one inter-die input block of the artificial intelligence processing die. Each artificial intelligence processing die among the plurality of identical artificial intelligence processing dies corresponds to at least one layer of a neural network.

In some implementations, the one or more communication paths are of equal length.

In some implementations, a first artificial intelligence processing die among the multiple identical artificial intelligence processing dies is located adjacent to a second artificial intelligence processing die among the multiple identical artificial intelligence processing dies and the orientation of the second artificial intelligence processing die is offset by 180 degrees from the orientation of the first artificial intelligence processing die.

In some implementations, a first artificial intelligence processing die among the multiple identical artificial intelligence processing dies is located adjacent to a second artificial intelligence processing die among the multiple identical artificial intelligence processing dies and the orientation of the second artificial intelligence processing die is same as the orientation of the first artificial intelligence processing die.

In some implementations, the multiple artificial intelligence processing dies are arranged in a sequence and at least one artificial intelligence processing die is configured to transmit data as an input to another artificial intelligence processing die that is arranged at an earlier position in the sequence than the at least one artificial intelligence processing die.

In some implementations, each artificial intelligence processing die among the multiple identical artificial intelligence processing dies is configured to receive data and perform AI computations using the received data.

In some implementations, each artificial intelligence processing die among the multiple identical artificial intelligence processing dies is configured with a systolic array and performs the AI computations using the systolic array.

In some implementations, each artificial intelligence processing die among the multiple identical artificial intelligence processing dies includes at least one host-interface input block different from the inter-die input block and at least one host-interface output block different from the inter-die output block.

In some implementations, each artificial intelligence processing die among the multiple identical artificial intelligence processing dies includes at least one multiplier-accumulator unit (MAC unit).

In some implementations, each artificial intelligence processing die among the multiple identical artificial intelligence processing dies includes at least a memory.

At least one aspect is directed to a method of processing neural network models. The method includes receiving, at a first artificial intelligence processing die of an artificial processing unit, a first set of data related to a network. The first artificial intelligence processing die is associated a layer of the neural network. The method includes performing, at the first artificial intelligence processing die, a first set of AI computations related to the layer of the neural network associated with the first artificial intelligence processing die using the first set of data related to the neural network. The method includes transmitting to a second artificial intelligence processing die of the artificial intelligence processing unit, result data from the first set of AI computations performed at the first artificial intelligence processing die. The second artificial intelligence processing die is associated with a different layer of the neural network from the first artificial intelligence processing die.

In some implementations, the first artificial intelligence processing die is associated with the input layer of the neural network.

In some implementations, the method includes performing, at the second artificial intelligence processing die, AI computations related to the layer of the neural network associated with the second artificial intelligence processing die using the result data from the computations performed at the first artificial intelligence processing die. The method includes transmitting result data from the AI computations performed at the second artificial intelligence processing die as feedback to the first artificial intelligence processing die.

In some implementation, the first artificial intelligence processing die and the second artificial intelligence processing die are arranged in a sequence and the first artificial intelligence processing die is arranged at an earlier position in the sequence than the second artificial intelligence processing die.

In some implementations, the method includes performing, at the first artificial intelligence processing die, a second set of AI computations related to the layer of the neural network associated with the first artificial intelligence processing die using the result data received as feedback from the second artificial intelligence processing die and the first set of data related to the neural network. The method includes transmitting result data from the second set of AI computations to the second artificial intelligence processing die.

In some implementations, the second artificial intelligence processing die is associated with the output layer of the neural network.

In some implementations, the method includes performing, at the second artificial intelligence processing die, AI computations related to the output layer of the neural network using the result data from the computations performed at the first artificial intelligence processing die. The method includes transmitting result data from the AI computations performed at the second artificial intelligence processing die to a co-processing unit communicatively coupled to the artificial intelligence processing unit.

In some implementations, the first artificial intelligence processing die and the second artificial intelligence processing die include at least one multiplier-accumulator unit (MAC unit).

In some implementations, the first artificial intelligence processing die and the second artificial intelligence processing die include a memory.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

This disclosure generally relates to an apparatus, a system, and a mechanism for processing workloads of neural networks. Efficient processing of neural networks takes advantage of custom application specific integrated circuits (ASICs). However designing a custom ASIC has several challenges including, but not limited to, long design times and significant non-recurring engineering costs, which are exacerbated when the ASIC is produced in small volumes.

The challenges of using custom ASICs can be overcome by designing a standard die, which is configured for processing neural network tasks and interconnecting several such identical dies in a single ASIC chip package. The number of dies interconnected in a single chip package varies based on the complexity or number of layers of the neural network being processed by the host computing device. In packages with multiple identical dies, different dies are associated with different layers of the neural network, thus increasing the efficiency of processing neural network related tasks. By increasing or decreasing the number of dies in a single package based on an expected frequency of performing neural network tasks, the standard die can be used across multiple products, resulting in more efficient amortization of the costs of long design time and non-negligible non-recurring engineering.

Figure 1A:
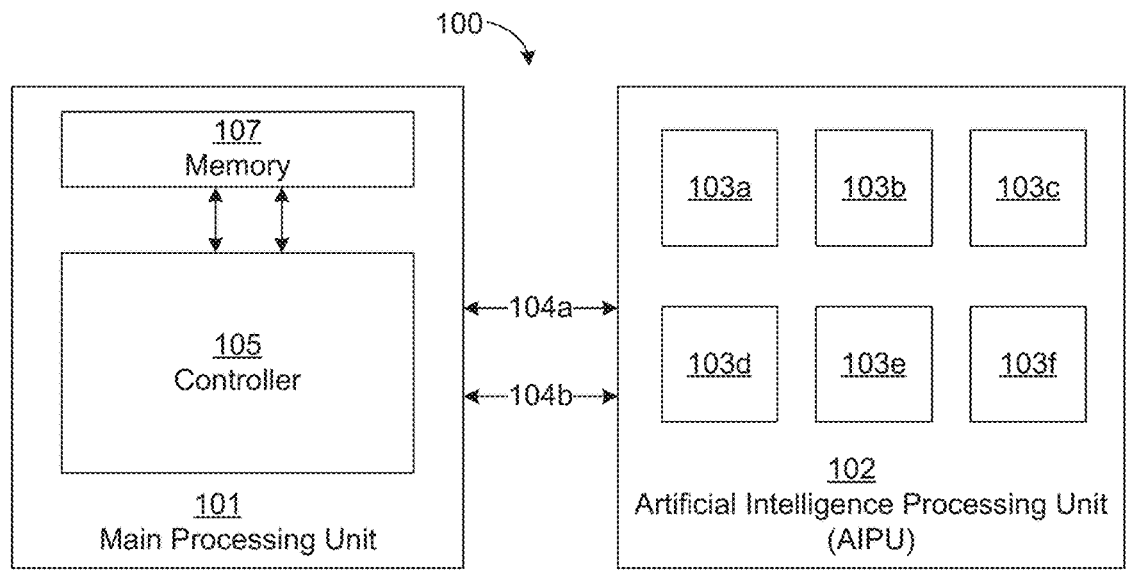
FIG. 1A illustrates a system for processing neural network related tasks, according to an illustrative implementation.

FIG. 1A illustrates a system 100 for processing computational tasks of neural networks, according to an illustrative implementation. The system 100 includes a main processing unit 101 and an artificial intelligence processing unit (AIPU) 102. The system 100 is housed within a host computing device (not shown). Examples of the host computing device include, but are not limited to, servers and internet-of-things (IoT) devices. The AIPU 102 is a co-processing unit of the main processing unit 101. The main processing unit 101 is communicatively coupled to the AIPU 102 by way of one or more communication paths, such as communication paths 104a, 104b that are part of a communication system, such as a bus. The main processing unit 101 includes a controller 105 and memory 107. The memory 107 stores configuration data related to the sub-processing units of main processing unit 101 and co-processing units coupled to the main processing unit 101. For example, memory 107 may store configuration data related to the AIPU 102. The main processing unit controller 105 is communicatively coupled to the memory 107 and is configured to select the configuration data from the memory 107 and transmit the configuration data to co-processing units coupled to the main processing unit 101 or sub-processing units of the main processing unit 101. Additional details of the selection and transmission of the configuration data by the main processing unit controller 105 is described below with reference to FIG. 3.

The AIPU 102 is configured to process computational tasks of a neural network. The AIPU 102 includes multiple artificial intelligence processing dies (AIPDs) 103a, 103b, 103c, 103d, 103e, 103f, collectively referred to herein as AIPDs 103. The AIPDs 103 are identical to each other. As described herein, an AIPD 103 is "identical" to another AIPD 103 if each AIPD 103 is manufactured using the same die design and the implementation of hardware units on each AIPD 103 is same as the other AIPD 103. Thus, in this disclosure, two AIPDs 103 can be configured to process different layers of a neural network yet still considered identical if the design of the die and implementation of the hardware units of the two AIPDs 103 are identical. The number of AIPDs 103 included in the AIPU 102 may vary based on the number of layers of the neural network models processed by the host computing device. For example, if the host computing device is an internet-of-things (IoT) device, such as a smart thermostat, then the number of layers of a neural network model being processed by the AIPU 102 of the smart thermostat will likely be less than the number of layers of a neural network model processed by the AIPU 102 of a host computing device in a data center, such as a server in data center.

In host computing devices processing simple neural network models, a single AIPD 103 may efficiently process the neural network related tasks of the host computing device. In host computing devices processing more complex neural network models or neural network models with multiple layers, multiple identical AIPDs 103 may be useful to efficiently process the neural network related tasks. Therefore, in some implementations, the AIPU 102 includes a single AIPD 103, while in other implementations, the AIPU 102 includes multiple identical AIPDs 103.

In implementations where the AIPU 102 includes multiple identical AIPDs 103, such as the one shown in FIG. 1A, each identical AIPD 103 is coupled to another identical AIPD 103. Further, each AIPD 103 is associated with at least one layer of the neural network being processed by the AIPU 102. Additional details of AIPDs 103 and the arrangement of multiple identical AIPDs 103 within an AIPU 102 are described below with reference to FIGS. 1B, 2A, 2B.

Figure 1B:
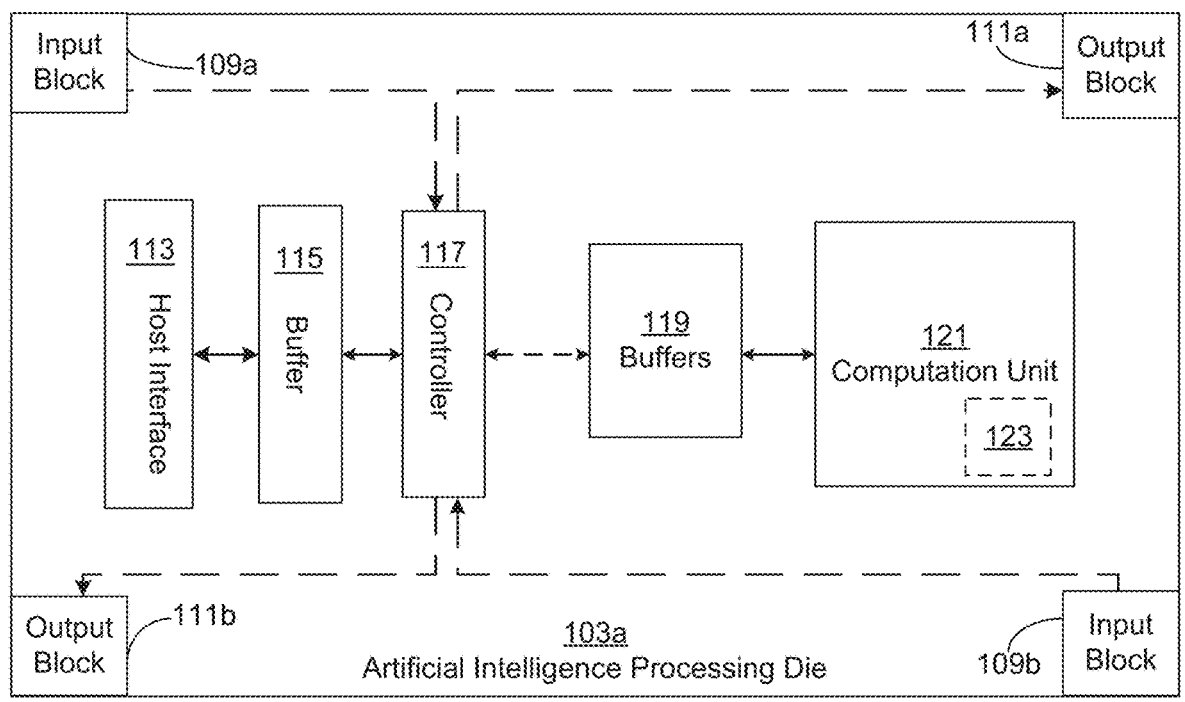
FIG. 1B illustrates functional logic of an artificial intelligence processing die of an artificial intelligence processing unit, according to an illustrative implementation.

Referring now to FIG. 1B, functional logic of an implementation of AIPD 103 is shown. For the purpose of providing a clear example, only functional logic of AIPD 103a is shown in FIG. 1B, however, since each of the AIPDs 103 is identical to each other, one skilled in the art would appreciate that functional logic of AIPDs 103b, 103c, 103d, 103e, 103f are identical to the functional logic of AIPD 103a. The AIPD 103a includes a host interface unit 113, a buffer 115, a controller 117, a buffer 119, a computation unit 121, inter-die input blocks 109a, 109b, and inter-die output blocks 11a, 11b.

The host interface unit 113 includes at least one input/output (I/O) block (not shown). The I/O block includes multiple I/O pins (not shown). The I/O pins of the I/O block of the host interface unit 113 are configured to be bi-directional, such that the I/O block can receive data from a source unit and transmit data to a destination unit. Examples of source and destination units include, but are not limited to, memory units, co-processors of the main processing unit 101, or other integrated circuit components configured to transmit or receive data. The host interface unit 113 is configured to receive data from the main processing unit controller 105 via the I/O pins of the host interface unit 113 and transmit data to the main processing unit controller 105, to the main processing unit 101, itself, or directly to memory 103 via the I/O pins of the host interface unit 113. The host interface unit 113 stores the data received from the main processing unit controller 105 in buffer 115.

The buffer 115 includes memory, such as registers, dynamic random-access memory (DRAM), static random-access memory (SRAM), or other types of integrated circuit memory, for storage of data. The AIPD controller 117 is configured to retrieve data from the buffer 115 and store data in buffer 115. The AIPD controller 117 is configured to operate based in part on the data transmitted from the main processing unit controller 105. If the data transmitted from the main processing unit controller 105 is configuration data, then, based on the configuration data, the AIPD controller 117 is configured to select the inter-die input and output blocks to be used for communications between AIPD 103a and another AIPD 103. Additional details of communication between AIPDs 103 are described below with reference to FIGS. 2A, 2B, and 2C. If the data transmitted from the main processing unit controller 105 are instructions to perform a neural network task, then the AIPD controller 117 is configured to store the data related to the neural network to the buffers 119 and perform the neural network task using the input data stored in the buffers 119, and the computation unit 121. The buffers 119 include memory, such as registers, DRAM, SRAM, or other types of integrated circuit memory, for storage of data. The computation unit 121 includes multiple multiply-accumulator units (MACs) (not shown), multiple Arithmetic Logic Units (ALUs) (not shown), multiple shift registers (not shown), and the like. Some of the registers of the buffers 119 are coupled to multiple ALUs of the computation unit 121 such that they establish a systolic array that allows for an input value to be read once and used for multiple different operations without storing the results prior to using them as inputs in subsequent operations. An example arrangement of such a systolic array is shown in FIG. 1C.

Figure 1C:
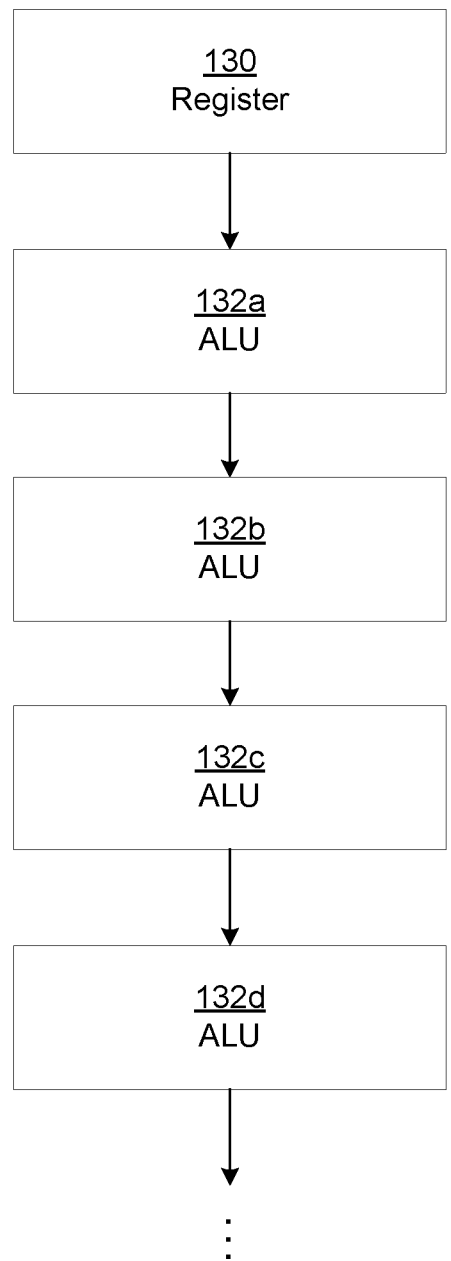
FIG. 1C illustrates an example arrangement of a systolic array on an artificial intelligence processing die, according to an illustrative implementation.

In FIG. 1C, register 130 is included in buffer 119 and data from register 130 is an input for a first operation at ALU 132a. The result from ALU 132a is an input into ALU 132b, the result from ALU 132b is an input into ALU 132c, and the result from ALU 132c is an input into ALU 132d, and so on. Such an arrangement and configuration distinguishes the AIPDs 103 from a general purpose computer, which typically stores the result data from one ALU back into a storage unit before using that result again. The arrangement shown in FIG. 1C also optimizes the AIPDs 103 for computations related to performing artificial intelligence tasks (referred to herein as "AI computations"), such as convolutions, matrix multiplications, pooling, element wise vector operations, and the like. Further, by implementing the arrangement shown in FIG. 1C, the AIPDs 103 are more optimized for power consumption and size in performing AI computations, which reduces the cost of AIPU 102.

Referring back to FIG. 1B, the computation unit 121 performs AI computations using input data and weights selected for the neural network and transmitted from a weight memory unit (not shown). In some implementations, the computation unit 121 includes an activation unit 123. The activation unit 123 can include multiple ALUs and multiple shift registers and can be configured to apply activation functions and non-linear functions to the results of the AI computations. The activation functions and non-linear functions applied by the activation unit 123 can be implemented in hardware, firmware, software, or a combination thereof. The computation unit 121 transmits the data resulting after applying the activation functions and/or other non-linear functions to the buffers 119 to store the data. The AIPD controller 117, using the inter-die output block configured for inter-die communication, transmits the output data from the computation unit 121 stored in the buffer 119 to an AIPD 103 communicatively coupled to the AIPD 103a. The configuration data received from the main processing unit controller 105 determines the inter-die communication paths between two AIPDs 103. For example, if the configuration data received at AIPD 103a indicates that inter-die output block 111a (as shown in FIG. 1B) should be used for inter-die communications, then the AIPD controller 117 transmits data to another AIPD 103 using the inter-die output block 111a. Similarly, if the configuration data indicates that the input block 109b (as shown in FIG. 1B) is to be used for inter-die communications, then the AIPD controller 117 selects the input block 109b as the inter-die input block for receiving data from another AIPD 103, and reads and processes the data received at the input block 109b.

Figure 2A:
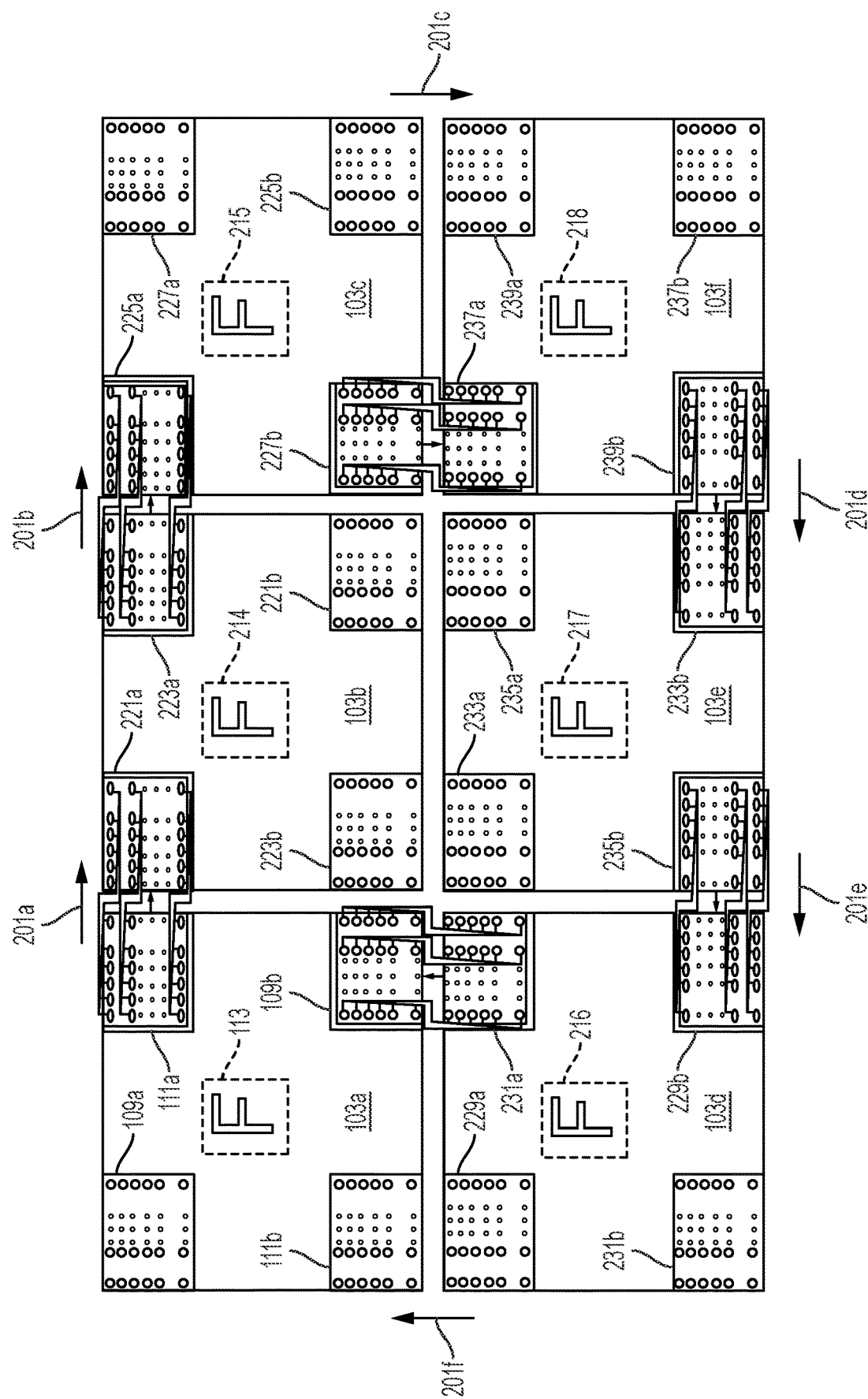
FIGS. 2A, 2B, 2C, and 2D illustrate example arrangements of artificial intelligence processing dies of an artificial intelligence processing unit, according to an illustrative implementation.

Each inter-die input and output blocks of an AIPD 103 includes multiple pins. Pins of an inter-die output block of an AIPD 103 can be connected by electrical interconnects to a corresponding pin of an inter-die input block of another AIPD 103. For example, as shown in FIG. 2A, the pins of output block 111a of the AIPD 103a are connected by electrical interconnects to the input block of the AIPD 103b. The electrical interconnects between the pins of inter-die output blocks and input blocks of different AIPDs 103 are of equal length.

While the connections between an inter-die output block of one AIPD 103 and the inter-die input block of another AIPD 103 are connected by electrical interconnects, the selection of a particular inter-die output block of an AIPD 103 and transmission of a particular signal or data to a particular pin of the inter-die output block may be programmable or modified based on the configuration data received by the AIPD 103 from the main processing controller 105. Through the selection of different output blocks of the AIPDs 103, the AIPU 102 can be configured to implement different requirements of different neural networks including, but not limited to, feedback loops between different layers of a neural network. Thus, a diverse set of neural networks can be executed using the same AIPU 102, resulting in reduction of design time costs and an efficient amortization of the non-recurring engineering costs. Additional details of the configuration of the AIPDs 103 and the AIPU 102 are described below with reference to FIGS. 2A, 2B, and 3.

As described above, each AIPD 103 among the multiple AIPDs 103 is associated with at least one layer of a neural network that the AIPU 102 is configured to process. The main processing unit 101 includes configuration data to configure the AIPDs 103 and the AIPU, such as the AIPU 102. The configuration data is associated with a neural network model that is selected to be processed by the AIPU. The configuration data specifies the associations between an AIPD 103 and a layer of the neural network being processed by the AIPU. Based on the configuration data associated with the neural network being processed by the AIPU, the main processing unit controller 105 associates an AIPD 103 with a layer of the neural network. In some implementations, the main processing unit controller 105 stores the association between an AIPD 103 and a layer of the neural network in a storage device, such as the memory 107 (shown in FIG. 1A). The main processing unit controller 105 transmits the configuration data associated with an AIPD 103 to the corresponding AIPD 103. The association of the AIPDs 103 with layers of neural network is based in part on the requirements of the neural network model being processed by the AIPU 102. For example, if the neural network includes a feedback loop between two layers of the neural network, then the AIPDs 103 associated with those two layers can be selected based in part on whether the inter-die output block of the first AIPD 103 and the inter-die input block of the second AIPD 103 are electrically interconnected. An example of such an arrangement of the multiple AIPDs 103 is described below with reference to FIG. 2A.

FIG. 2A illustrates an example arrangement of multiple AIPDs 103 within an AIPU, such as the AIPU 102. In FIG. 2A, the AIPU 102 includes six AIPDs 103 (AIPDs 103a, 103b, 103c, 103d, 103e, 103f) and is processing a neural network with six layers including a feedback loop between the last layer and the first layer of the neural network. The AIPD 103a includes inter-die input blocks 109a, 109b, inter-die output blocks 111a, 111b, and the host-interface unit 113. The AIPD 103b includes inter-die input blocks 221a, 221b, inter-die output blocks 223a, 223b, and the host-interface unit 214. The AIPD 103c includes inter-die input blocks 225a, 225b, inter-die output blocks 227a, 227b, and the host-interface unit 215. The AIPD 103d includes inter-die input blocks 229a, 229b, inter-die output blocks 231a, 231b, and the host-interface unit 216. The AIPD 103e includes inter-die input blocks 233a, 233b, inter-die output blocks 235a, 235b, and the host-interface unit 217. The AIPD 103f includes inter-die input blocks 237a, 237b, inter-die output blocks 239a, 239b, and the host-interface unit 218.

Each AIPD 103 is associated with a particular layer of the neural network and, as described above, the association of an AIPD 103 with a layer of the neural network is based in part on the features related to that layer of the neural network. Since the neural network in FIG. 2A requires a feedback loop between the last layer and the first layer of the neural network, the last layer and the first layer of the neural network should be associated with AIPDs 103 where an inter-die output block of the AIPD 103 associated with the last layer of the neural network is electrically interconnected with an inter-die input block of the AIPD 103 associated with the first layer of the neural network. As shown in FIG. 2A, such an arrangement can be accomplished by associating the AIPD 103a with the first layer and associating the AIPD 103d with the sixth layer since the inter-die output block 231a of the AIPD 103d is electrically interconnected to the inter-die input block 109b of the AIPD 103a. Accordingly, the AIPDs 103b, 103c, 103f, 103e are associated with the second, third, fourth, and fifth layers of the neural network, respectively. The sequence of the arrangement of the AIPDs 103 in FIG. 2A is the AIPD 103a is in the first position of the sequence, the AIPD 103b is in the second position, the AIPD 103c is in the third position, the AIPD 103f is in the fourth position, the AIPD 103e is in the fifth position, the AIPD 103d is in the sixth position, and then the AIPD 103a is in the seventh position. The sequence of communication of the neural network related data between the AIPDs 103, as indicated by 201a, 201b, 201c, 201d, 201e, 201f, starts from 103a, then to 103b, then to 103c, 103f, 103e, 103d, and back to 103a to incorporate the feedback layer between the sixth layer and the first layer of the neural network. As described herein, "neural network related data" includes, but is not limited to, computation result data such as the output of the computation unit 121, parameter weight data, and other neural network parameter related data.

The AIPD controller of the AIPD 103 associated the output layer of the neural network is configured to transmit the result data from the output layer to the main processing unit 101. For example, if the AIPD associated with the output layer is 103d, then the AIPD controller 216 is configured to transmit the result data from the AIPD 103d to the main processing unit 101. In some implementations, a single AIPD 103 is configured to receive an initial input data of a neural network from the main processing unit 101 and transmit the result data from the last layer of the neural network to the main processing unit 101. For example, in FIG. 2A, if the AIPD 103a receives the initial input data of the neural network from the main processing unit 101 and also the result data from the AIPD 103d, the AIPD associated with the last layer of the neural network, then the AIPD controller 113 of the AIPD 103a can be configured to transmit the result data from the AIPD 103d, which is received at the inter-die input block 111b, to the main processing unit 101.

Using the same AIPDs 103 described above a different neural network than the neural network described with reference to FIG. 2A can be processed. For example, if a neural network has a feedback loop between the sixth layer and the third layer of the neural network, then the sixth layer and the third layer should be associated with the AIPDs 103 where an inter-die output block of the AIPD 103 associated with the sixth layer of the neural network is electrically interconnected with an inter-die input block of the AIPD 103 associated with the third layer of the neural network. Additionally, each of the AIPDs 103 associated with the different layers of the neural network should have at least one inter-die output block electrically interconnected with at least one inter-die input block of another AIPD 103 associated with a subsequent layer of the neural network. For example, the AIPD 103 associated with the first layer should have an inter-die output block electrically interconnected with an inter-die input block of the AIPD 103 associated with the second layer of the neural network; the AIPD 103 associated with the second layer should have an inter-die output block electrically interconnected with an inter-die input block of the AIPD 103 associated with the third layer of the neural network; the AIPD 103 associated with the third layer should have an inter-die output block electrically interconnected with an inter-die input block of the AIPD 103 associated with the fourth layer of the neural network; the AIPD 103 associated with the fourth layer should have an inter-die output block electrically interconnected with an inter-die input block of the AIPD 103 associated with the fifth layer of the neural network; and the AIPD 103 associated with the fifth layer should have an inter-die output block electrically interconnected with an inter-die input block of the AIPD 103 associated with the sixth layer of the neural network. Processing of such a neural network can be accomplished using the arrangement of the AIPDs 103 in FIG. 2B.

Figure 2B:
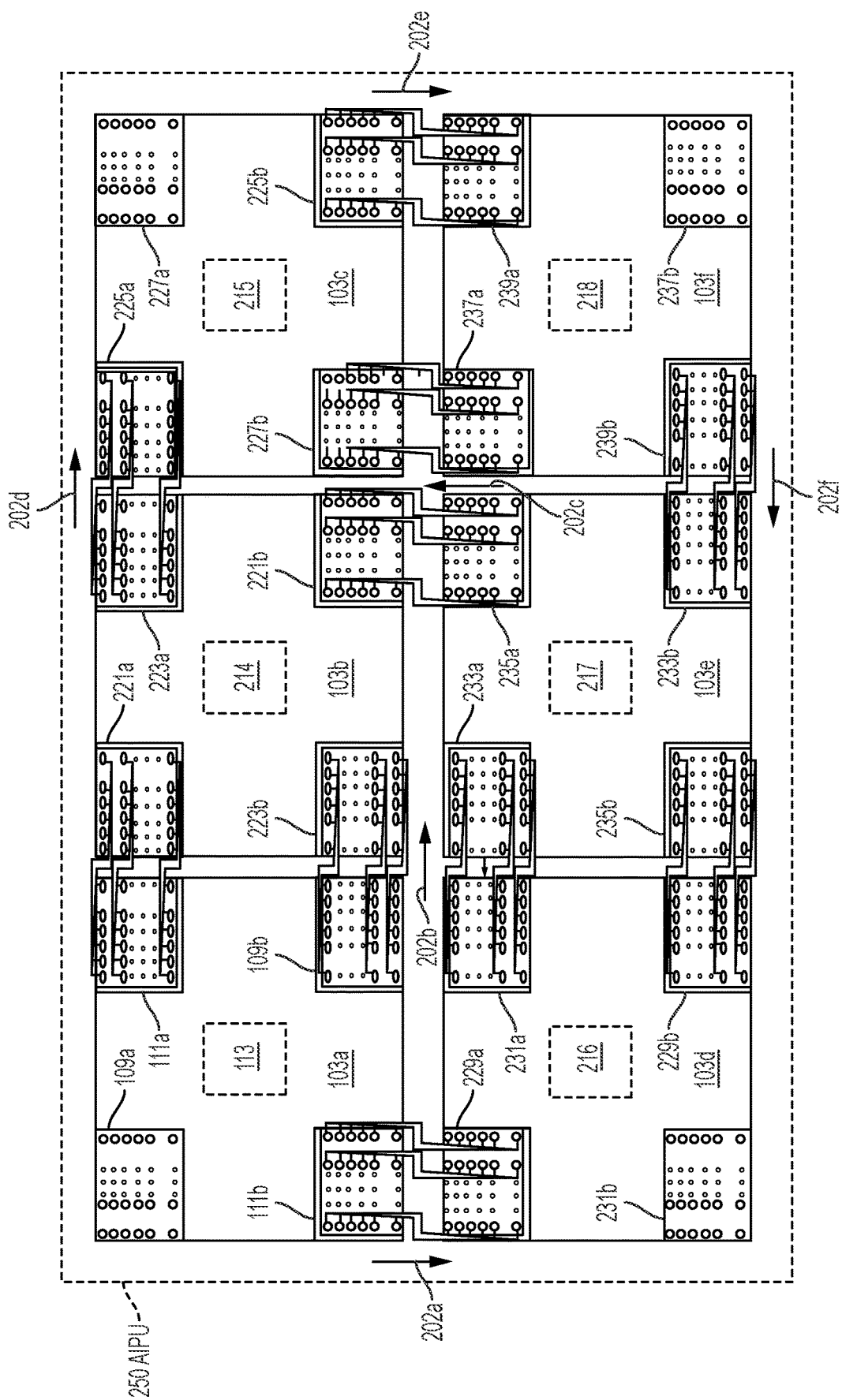

FIG. 2B illustrates a different example arrangement of the AIPDs 103 within an AIPU. In FIG. 2B, the AIPU 250 includes the AIPDs 103a, 103b, 103c, 103d, 103e, 103f. Within the AIPU 250, the inter-die output block 111a of the AIPD 103a is electrically interconnected to the inter-die input block 221a of the AIPD 103b and the inter-die output block 111b of the AIPD 103a is electrically interconnected to the inter-die input block 229a of the AIPD 103d; the inter-die output block 223b of the AIPD 103b is electrically interconnected to the inter-die input block 109b of the AIPD 103a; the inter-die output block 223a of the AIPD 103b is electrically interconnected to the inter-die input block 225a of the AIPD 103c; the inter-die output block 227b of the AIPD 103c is electrically interconnected to the inter-die input block 237a of the AIPD 103f; the inter-die output block 239a of the AIPD 103f is electrically interconnected to the inter-die input block 225b of the AIPD 103c and the inter-die output block 239b of the AIPD 103f is electrically interconnected to the inter-die input block 233b of the AIPD 103e; the inter-die output block 235a of the AIPD 103e is electrically interconnected to the inter-die input block 221b of the AIPD 103b and the inter-die output block 235b of the AIPD 103e is electrically interconnected to the inter-die input block 229b of the AIPD 103d; the inter-die output block 231a of the AIPD 103d is electrically interconnected to the inter-die input block 233a of the AIPD 103e.

In FIG. 2B, the AIPD 103f is associated with the sixth layer of the neural network and the AIPD 103e is associated with the third layer of the neural network. The AIPDs 103a, 103d, 103b, 103c are associated with the first, second, fourth, and fifth layers of the neural network, respectively. The AIPD controller 113 is configured to transmit result data from the computations at the AIPD 103a to the AIPD 103d, the AIPD 103 associated with the second layer of the neural network, using the inter-die output block 111b of the AIPD 103a, which is electrically interconnected to the inter-die input block 229a of the AIPD 103d. The AIPD controller 216 of the AIPD 103d is configured to transmit result data from the AIPD 103d to the AIPD 103e, the AIPD 103 associated with the third layer of the neural network, using the inter-die output block 231a, which is electrically interconnected to the inter-die input block 233a of the AIPD 103e. The AIPD controller 217 of the AIPD 103e is configured to transmit result data from the AIPD 103e to the AIPD 103b, the AIPD 103 associated with the fourth layer of the neural network, using the inter-die output block 235a of the AIPD 103e, which is electrically interconnected to the inter-die input block 221b of the AIPD 103b. The AIPD controller 214 of the AIPD 103b is configured to transmit result data from the AIPD 103b to the AIPD 103c, the AIPD 103 associated with the fifth layer of the neural network, using the inter-die output block 223a, which is electrically interconnected to the inter-die input block 225a of the AIPD 103c. The AIPD controller 215 of the AIPD 103c is configured to transmit result data from the AIPD 103c to the AIPD 103f, the AIPD 103 associated with the sixth layer of the neural network, using the inter-die output block 227b of the AIPD 103c, which is electrically interconnected to the inter-die input block 237a of the AIPD 103f. The AIPD controller 218 is configured to transmit feedback data from the AIPD 103f to the AIPD 103e, the AIPD 103 associated with the third layer of the neural network, using the inter-die output block 239b of the AIPD 103f, which is electrically interconnected to the inter-die input block 233b of the AIPD 103e. The AIPD controller 218 of the AIPD 103f is further configured to transmit the result data from the AIPD 103f to the main processing unit 101 if the AIPD 103f is associated with the output layer of the neural network. The sequence of the arrangement of the AIPDs 103 in FIG. 2B is the AIPD 103a is in the first position of the sequence, the AIPD 103d is in the second position, the AIPD 103e is in the third position, the AIPD 103b is in the fourth position, the AIPD 103c is in the fifth position, the AIPD 103f is in the sixth position, and then the AIPD 103e is in the seventh position. The sequence of communication of the neural network related data in FIG. 2B between the AIPDs 103, as indicated by 202a, 202b, 202c, 202d, 202e, 202f, starts from 103a, then to 103d, 103e, 103b, 103c, 103f and then the feedback data to 103e.

Therefore, the same identical AIPDs can be utilized to process different neural networks with different neural network requirements. Thus, the design of a single artificial intelligence processing die (AIPD) can be utilized in the processing and execution of different neural networks with different requirements, resulting in reduction of design time related costs and an efficient amortization of the non-recurring engineering costs.

Furthermore, by modifying the configuration data associated with an AIPU and/or the configuration data associated with the AIPDs of that AIPU, a single AIPU can be utilized to process different neural networks. For example, in FIG. 2B, if a neural network with four layers is to be processed by the AIPU 250, then the configuration data associated with the AIPU 250 and/or the configuration data associated with the AIPDs 103 of the AIPU 250 can be modified to associate the AIPD 103a with the first layer of the neural network, the AIPD 103b with the second layer of the neural network, the AIPD 103c with the third layer of the neural network, and the AIPD 103f with the fourth layer of the neural network. The electrical interconnections between the inter-die output blocks and inter-die input blocks of these AIPDs 103 are described above. Once the AIPU 250 and the AIPDs 103 of the AIPU 250 are reconfigured, the main processing unit controller 105 transmits the input data related to the neural network to the AIPD associated with the first layer of the neural network, the AIPD 103a. Based on the modified configuration data associated with the AIPD 103a and on the input data to the neural network, the AIPD 103a performs computations related to the first layer of the new neural network, including AI computations, and transmits the result data to the AIPD 103b using the inter-die output block 11a. As described herein, "computations related to a layer of the neural network" includes AI computations related to that layer of the neural network. The AIPD 103b performs the computations related to the second layer of the neural network, including AI computations, based on the result data received from the AIPD 103a at the inter-die input block 221a and on the modified configuration data associated with the AIPD 103b. The AIPD 103b transmits the result data to the AIPD 103c using the inter-die output block 223a. The AIPD 103c performs computations related to the third layer of the neural network, including AI computations, based on the result data received from the AIPD 103b at the inter-die input block 225a and on the modified configuration data associated with the AIPD 103c, and transmits the result data to the AIPD 103f using the inter-die output block 227b. The AIPD 103f performs computations related to the fourth layer of the neural network, including AI computations, based on the result data received from the AIPD 103c at the inter-die input block 237a and on the modified configuration data associated with the AIPD 103f. The AIPD 103f, the AIPD 103 associated with the last layer of the neural network, is configured to transmit the result data from the AIPD 103f to the main processing unit 101. Therefore, by modifying configuration data associated with the AIPU and/or the configuration data of the AIPDs of the AIPU, a single AIPU can be reprogrammed to process a different neural network. Thus, amortizing the non-negligible non-recurring engineering costs related to the use of a custom ASIC more efficiently, and further reducing design time costs associated with designing a custom ASIC for processing the tasks of this particular neural network.

In some implementations, at least one inter-die input block and at least one inter-die output block are placed on one edge of the AIPD 103, and at least one inter-die output block and at least one inter-die input block are located on another edge of the AIPD 103. For example, as shown in FIG. 2A, one inter-die input block and one inter-die output block are located at the top edge of the AIPDs 103 and another inter-die output block and inter-die input block are located at the bottom edge of the AIPDs 103. In some implementations, all inter-die input blocks are located on one edge of the AIPD 103 and all inter-die output blocks are located on another edge of the AIPD 103. An example of such an arrangement of the inter-die input and output blocks is shown in FIG. 2C.

Figure 2C:
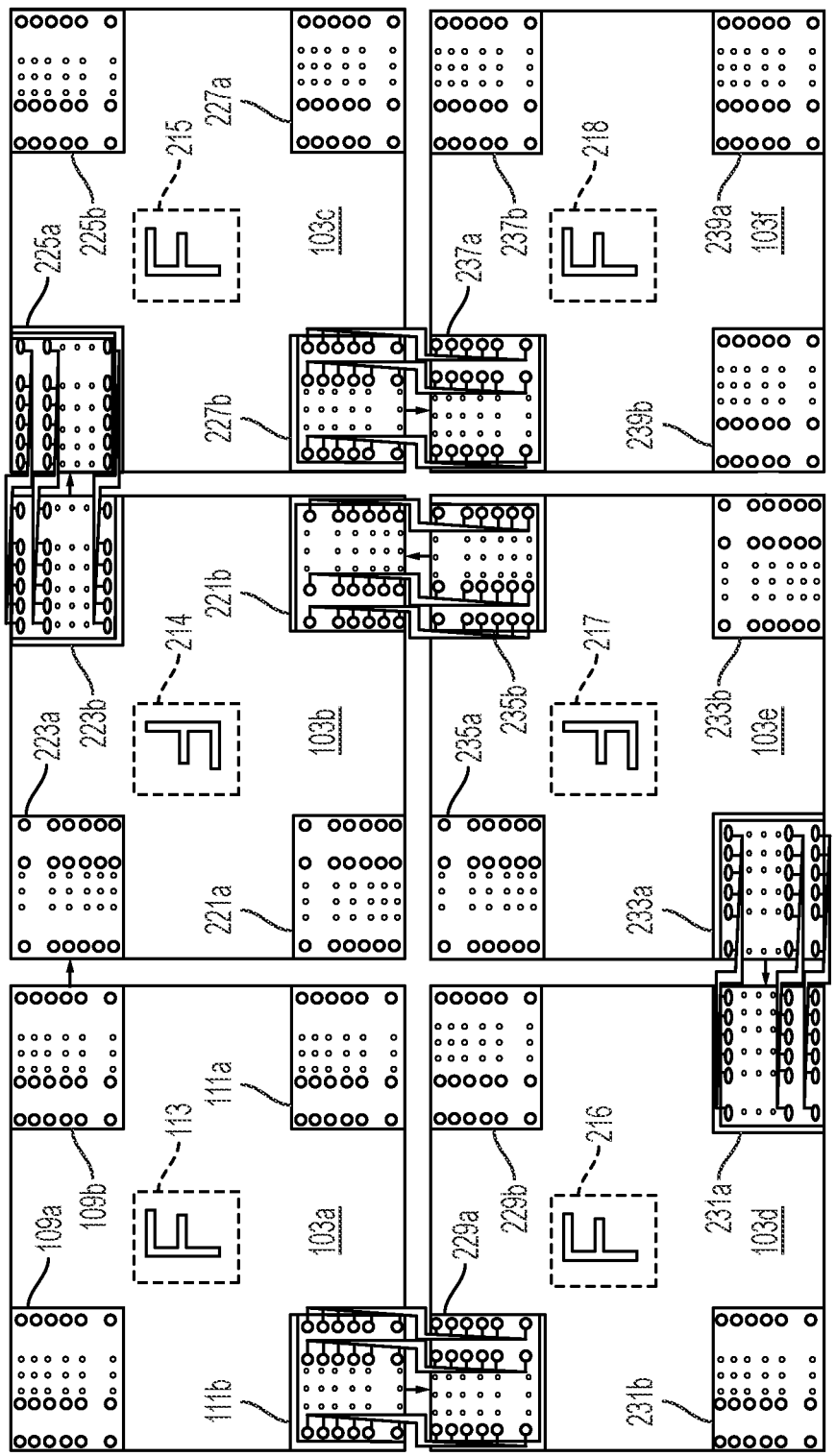

In FIG. 2C, all inter-die input blocks are located at the top edge of the AIPD 103 and all inter-die output blocks are located at the bottom edge of the AIPD 103. In some implementations, the orientation of some of the AIPDs 103 are offset by a certain distance or degree relative to the orientation of other AIPDs 103 in order to implement equal length electrical interconnections between the AIPDs 103 and to achieve a more efficient size for the AIPU that includes the AIPDs 103 shown in FIG. 2C. For example, as shown in FIG. 2C, the AIPDs 103b and 103e are rotated by 180 degrees relative to the orientation of the AIPDs 103a, 103d, 103c, and 103f. By rotating the AIPDs 103 by 180 degrees, the inter-die input and output blocks of the AIPDs 103b, 103e are located adjacent to the inter-die output and input blocks of the AIPD 103a, 103d, 103c, 103f, which allows the length of the electrical interconnections between all the AIPDs 103 to be of equal length and does not require additional area for the electrical interconnections between the inter-die input and output blocks of the AIPDs 103b or 103e and any adjacent AIPDs 103.

In FIG. 2C, an AIPU with the arrangement of the AIPDs 103 shown in FIG. 2C can process a neural network similar to the AIPUs discussed above. For example, a neural network with six layers and no feedback loop between layers can be processed by the arrangement of the AIPDs 103 shown in FIG. 2C by associating the AIPD 103a with the first layer, the AIPD 103d with the second layer, the AIPD 103e with the third layer, the AIPD 103b with the fourth layer, the AIPD 103c with the fifth layer, and the AIPD 103f with the sixth layer of the neural network. The sequence of the arrangement of the AIPDs 103 in FIG. 2C is the AIPD 103a is in the first position of the sequence, the AIPD 103d is in the second position, the AIPD 103e is in the third position, the AIPD 103b is in the fourth position, the AIPD 103c is in the fifth position, and the AIPD 103f is in the sixth position. The sequence of communication between the AIPDs 103 starts from the AIPD 103a, then to the AIPDs 103d, 103e, 103b, 103c, and then 103f.

Figure 2D:
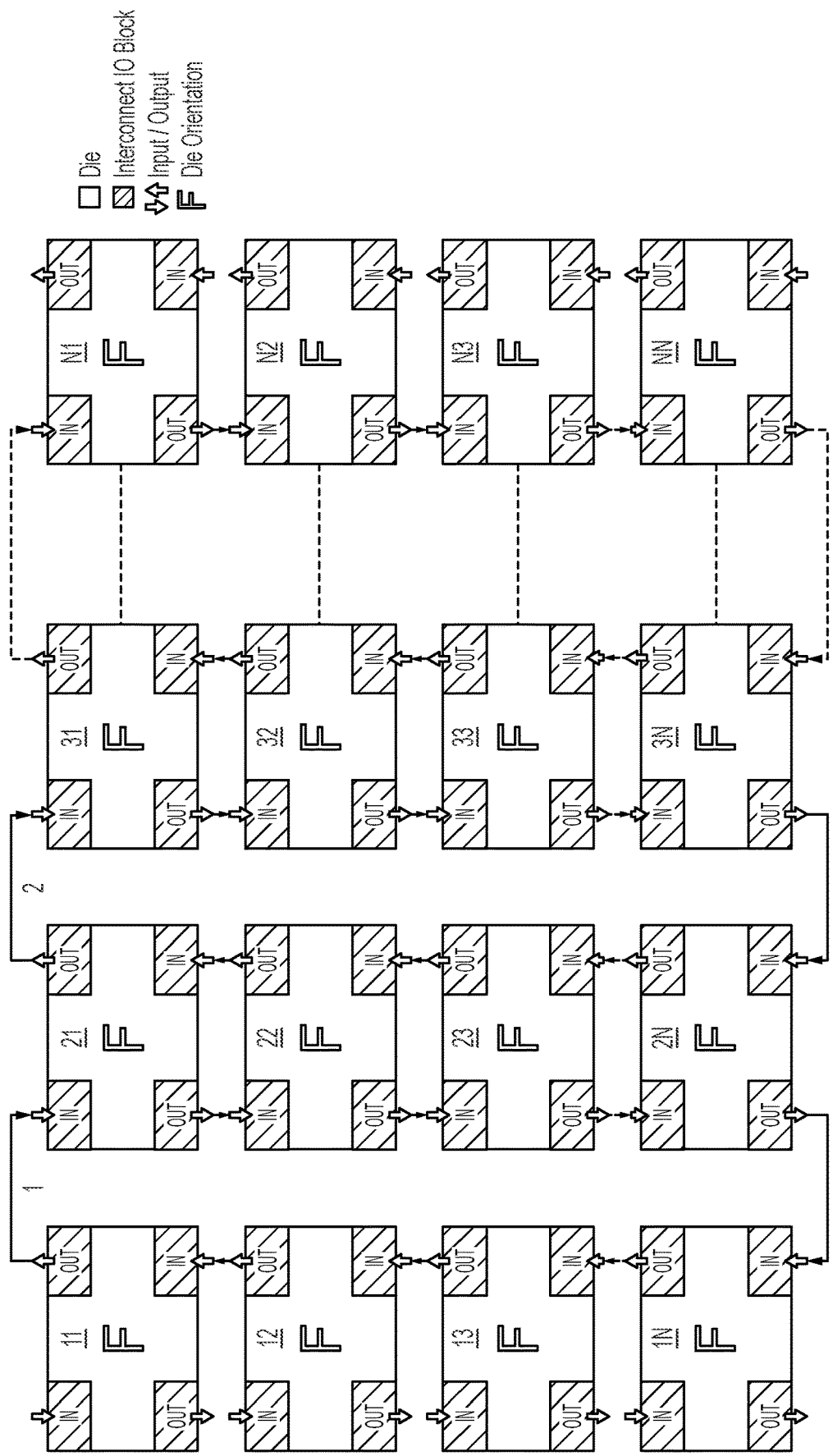

Among the benefits of the design and the implementation of the AIPDs described herein is that any number of AIPDs can be included within a single AIPU package. The number of AIPDs within a single AIPU package is only limited by the size of the AIPU package and not the size of the die of the AIPDs. Therefore, in a single AIPU package an N×N arrangement of the AIPDs can be included, as shown by the arrangement of AIPD 11 through AIPD NN in FIG. 2D. AIPD 11 through AIPD NN of FIG. 2D are similarly designed and configured as the AIPDs 103 described above.

The main processing unit controller 105 is configured to transmit the initial input data of the neural network to the AIPD 103 associated with the first layer (input layer) by way of the host-interface unit of the AIPD 103. For example, as shown in FIGS. 2A, 2B, and 2C, the AIPD 103 associated with the first layer of the neural network is the AIPD 103a, and the main processing unit controller 105 transmits the initial input data to the AIPD 103a by way of the host-interface unit 113. In some implementations, the last AIPD 103 in the sequence of communication is configured to transmit the result data back to main processing unit 101 using the host-interface unit of the AIPD. In some implementations, the AIPD 103 associated with the last layer of the neural network is configured to transmit the result data back to the main processing unit 101. For example, in FIG. 2A, as described above, the last AIPD 103 in the sequence of communication is the AIPD 103a, therefore, in some implementations, the AIPD controller 117 of the AIPD 103a is configured to transmit the result data to the main processing unit 101 using the host-interface unit 113. Similarly, in FIG. 2B, the AIPD 103f is the AIPD 103 associated with the last layer of the neural network and, in some implementations, the AIPD controller 218 of the AIPD 103f is configured to transmit the result data to the main processing unit 101 using the host-interface unit of the AIPD 103f. An example method for configuring the AIPDs 103 for neural network processing is described below with reference to FIG. 3.

Figure 3:
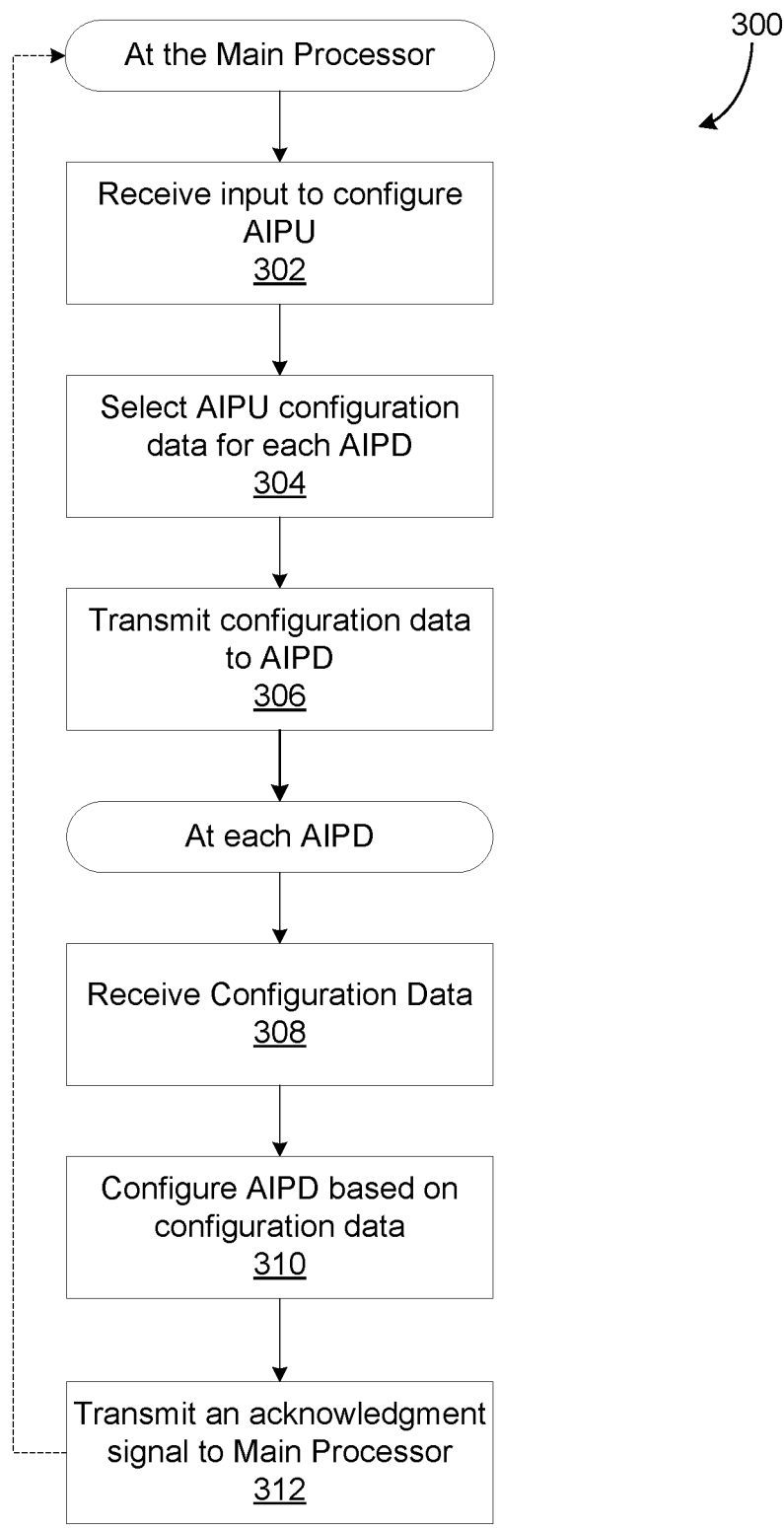
FIG. 3 is a flowchart of an example method configuring artificial intelligence processing dies, according to an illustrative implementation.

FIG. 3 is a flowchart of an example method 300 of configuring an AIPU for processing a neural network model. At the main processor, the method 300 includes receiving an input to configure the AIPU (stage 302). The method 300 includes selecting the AIPU configuration data (stage 304). The method 300 includes transmitting the configuration data to the AIPDs 103 of the AIPU (stage 306). At each AIPD 103, the method 300 includes receiving configuration data (stage 308). The method 300 includes configuring the AIPD 103 based on the configuration data (stage 310). The method 300 includes transmitting acknowledgment to the main processing unit 101 (stage 312).

The method 300 includes, at the main processing unit 101, receiving an input to configure the AIPU (stage 302). In response to receiving the input to configure the AIPU, the method 300 includes selecting the AIPU configuration data for each AIPD 103 within the AIPU (stage 304). The main processing unit controller 105 of the main processor 101 selects configuration data related to the AIPU. In selecting the configuration data related to the AIPU, the main processing unit controller 105 selects configuration data associated with each of the AIPDs 103 of the AIPU. Different configuration data may specify different values to configure an AIPD 103 for neural network processing including, but not limited to, the inter-die output and input blocks of the associated AIPDs 103 to be configured for transmission and reception of neural network related data between the associated AIPD 103 and another AIPD 103, the mapping of output data to the pins of the inter-die output block 103, and neural network related data, such as parameters, parameter weight data, number of parameters. The values specified by the configuration data are based on the layer of the neural network with which the corresponding AIPD 103 is associated. Therefore, the values of the configuration data associated with one AIPD 103 can be different from the values of the configuration data associated with a different AIPD 103. For example, if the first layer of the neural network being processed by the AIPU requires a first set of weight values to be used for the computation tasks of the first layer of the neural network and the second layer of the neural network requires a second set of weight values, different from the first set of weight values, to be applied during the computation tasks of the second layer, then the configuration data associated with the AIPD 103 associated with the first layer of the neural network will specify weight values corresponding to the first set of weight values while the configuration data associated with the AIPD 103 associated with the second layer of the neural network will specify weight values corresponding to the second set of the weight values.

The inter-die output block of an AIPD 103 specified in the configuration data for transmission of neural network related data to the AIPD 103 associated with the next layer of the neural network is based in part on the location of the AIPD 103 relative to the AIPD 103 associated with the next layer of the neural network. For example, if the AIPD 103a is associated with a first layer of the neural network and the AIPD 103b is associated with the next layer of the neural network, then the inter-die output block of the AIPD 103a specified in the configuration data for the AIPD 103a will be the inter-die output block that is electrically interconnected to an inter-die input block of the AIPD 103b, which, as shown in FIG. 2A, FIG. 2B, and FIG. 2C, is inter-die output block 111a. Similarly, if the AIPD 103d is associated with the next layer after the layer associated with the AIPD 103a, then the inter-die output block selected for transmitting neural network related data and specified in the configuration data of the AIPD 103a is the inter-die output block electrically interconnected to an inter-die input block of the AIPD 103d, which as shown in FIG. 2A, FIG. 2B, and FIG. 2C is inter-die output block 111b.

Each AIPD 103 is associated with a unique identifier, and in some implementations, the configuration data of an AIPD 103 is associated with the unique identifier of that AIPD 103 and the main processing unit controller 105 is configured to select the configuration data of an AIPD 103 based on the unique identifier associated with the AIPD 103.

The method 300 includes transmitting the selected configuration data to the AIPDs 103 (stage 306). As described above, the main processing unit controller 105 transmits the configuration data to the AIPDs 103 by way of the host-interface unit of the AIPDs 103, such as the host-interface unit 113 of the AIPD 103a. In some implementations, the main processing unit controller 105 is configured to periodically check whether configuration data for any AIPD 103 has been updated and in response to the configuration data of an AIPD 103 being updated, the main processing unit controller 105 transmits the updated configuration data to the particular AIPD 103. In some implementations the main processing unit controller 105 transmits instructions to the AIPDs 103 to configure the AIPD 103 based on the received configuration data. In some implementations, the configuration data is stored on the host computing device memory and the AIPDs 103 are configured to read data stored on the memory of the host computing device. In such implementations, the main processing unit controller 105 transmits instructions to the AIPDs 103 to read configuration data from the host-computing device memory and to configure the AIPD 103 based on the configuration data.

The method 300 includes, at each AIPD 103, receiving the configuration data (stage 308) and configuring the AIPD 103 based on the received configuration data (stage 310). As described above, the AIPD controller of the AIPD 103, such as the AIPD controller 117 of the AIPD 103a, is configured to select the inter-die input and output blocks and configure them for receiving data from and transmitting data to other AIPDs 103 based on the received configuration data. The AIPD controller of the AIPD 103 is also configured to, based on the received configuration data, transmit certain output data of the AIPD 103, such as the output from the computation unit 121, to a particular pin of the selected inter-die output block selected for transmission of the neural network related data to another AIPD 103. The AIPD controller of the AIPD 103 is further configured to store neural network related data, such as parameter weight data, in storage devices such as buffers 119 and utilize the neural network related data during the computations related to the layer of the neural network associated with the AIPD 103.

The method 300 includes, at each AIPD 103, transmitting an acknowledgment signal to the main processor 101 (stage 312). The AIPD 103 transmits the acknowledgment signal to the main processor 101 using the host-interface unit, such as the host-interface unit 113 of the AIPD 103a. The acknowledgment transmitted to the main processor 101 indicates to the main processor that the configuration of the AIPD 103 is successful. In some implementations, if an error is encountered during the configuration of the AIPD 103, the AIPD 103 transmits an error message to the main processor 101 using the host-interface unit. After the successful configuration of the necessary AIPDs 103, the AIPU is ready to process neural network related tasks. The main processing unit controller 105 transmits the neural network tasks to the AIPU for the execution of the neural network task. An example method for processing neural network tasks by the AIPU is described below with reference to FIG. 4.

Figure 4:
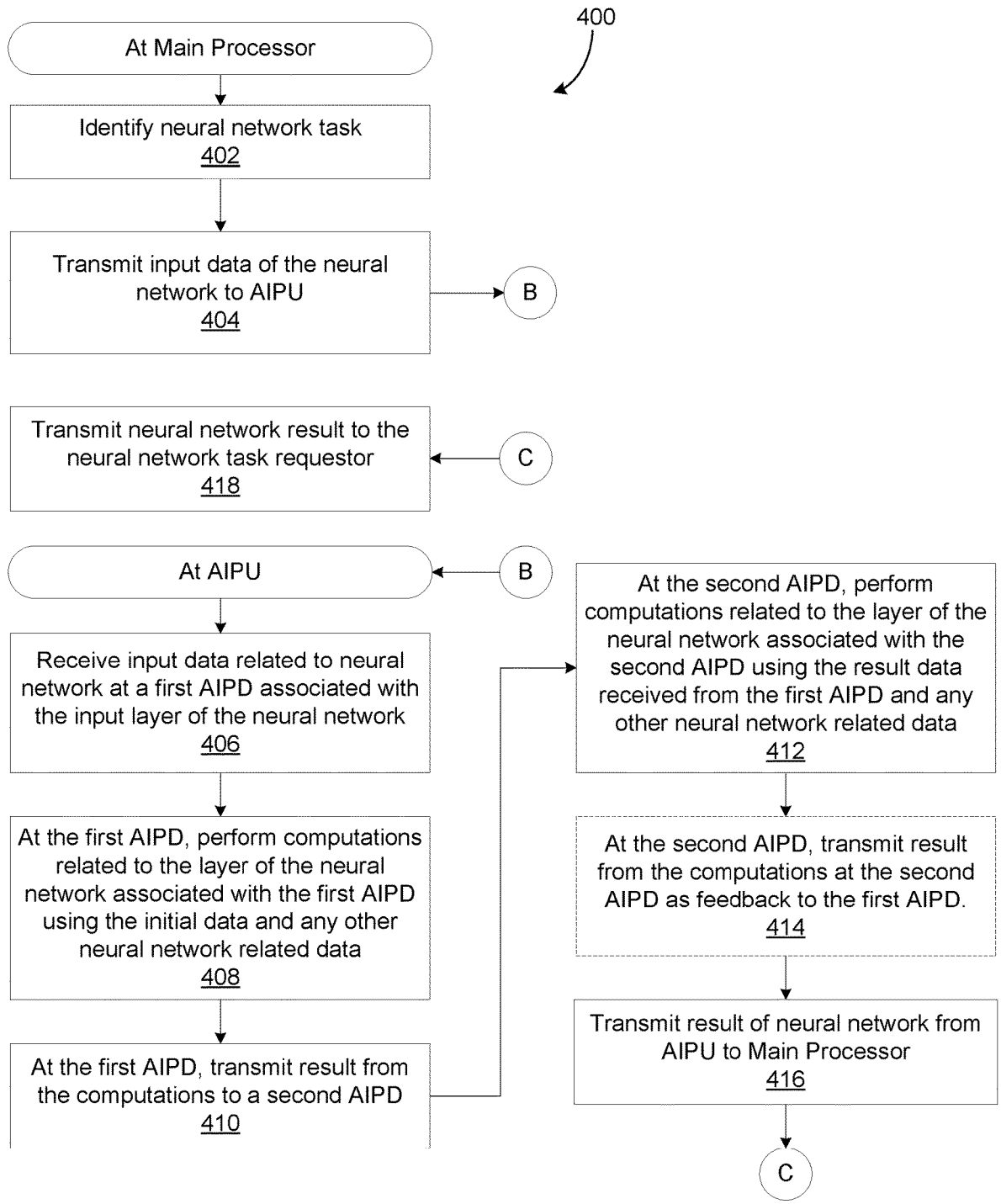
FIG. 4 is flowchart of an example method of processing neural network tasks based on an neural network model, according to an illustrative implementation.

FIG. 4 is a flowchart of an example method 400 of processing neural network related tasks by the AIPU. At the main processor 101, the method 400 includes identifying a neural network task (stage 402). The method 400 includes transmitting initial data or input data related to the neural network to the AIPU (stage 404). At the AIPU, the method 400 includes receiving initial data related to the neural network at a first AIPD 103 associated with the input layer of the neural network (stage 406). The method 400 includes, at the first AIPD 103, performing computations related to the layer of the neural network associated with the first AIPD 103 using the initial data and any neural network related data received with the configuration data of the first AIPD 103 (stage 408). The method 400 includes, transmitting the result from the computations to a second AIPD (stage 410). The method 400 includes, at the second AIPD 103, performing computations related to the layer of the neural network associated with the second AIPD 103 using the result data received from the first AIPD (stage 412). The method 400 includes, in some implementations, transmitting results from the computations at the second AIPD 103 as feedback to the first AIPD 103 (stage 414). The method 400 includes, transmitting the result of the neural network from the AIPU to the main processor (stage 416). The method 400 includes, at the main processor, transmitting the neural network result to user (stage 418).

The method 400 includes, at the main processor 101, identifying a neural network task (stage 402). The main processing unit controller 105 is configured to identify whether a requested task is a neural network related task. In some implementations, the request message or data for the requested task carries a specific indicator, such as a high or low bit in particular field of a message, which indicates that the requested task is a neural network related task, and the main processing unit controller 105 is configured to determine whether a requested task is a neural network task based on the specific indicator.

The method 400 includes, at the main processor 101, transmitting input data of the neural network to the AIPU (stage 404). The main processing unit controller 105 of the main processing unit 101 retrieves the input data from the memory of the host computing device and transmits it to the AIPD 103 associated with the initial or input layer of the neural network being processed by the AIPU. The main processing unit controller 105 identifies the AIPD 103 associated with the input layer of the neural network based on the configuration data associated with each of the AIPDs 103. In some implementations, the identifier of the AIPD 103 associated with the input layer of the neural network is stored in memory or a storage unit such as a register or a buffer and the main processing unit controller 105 determines the AIPD 103 associated with the input layer based on the identifier stored in memory or the storage unit. In implementations where the AIPDs 103 are configured to read data stored in the memory of the host computing device, the main processing unit controller 105 transmits instructions to the AIPD 103 associated with the input layer of the neural network to retrieve the input data to the neural network from the memory of the host computing device.

The method 400 includes, receiving input data related to the neural network at a first AIPD 103 associated with the input layer of the neural network (stage 406), such as the AIPD 103a as described earlier with reference to FIGS. 2A, 2B, and 2C. The method 400 includes, at the first AIPD 103, performing computations related to the layer of the neural network associated with the first AIPD 103 using the initial data received at the first AIPD 103 and any other neural network related data received during the configuration of the first AIPD 103 (stage 408). The controller of the first AIPD 103 determines the computations to be performed based on the associated neural network layer. For example, if the first layer of the neural network performs matrix multiplications by applying a matrix of weights to the input data, then during the configuration of the AIPD 103 the matrix of weights will be transmitted to the first AIPD 103 and stored in a buffer of AIPD 103. The AIPD controller of the first AIPD 103 is configured to transmit the matrix of weights to the computation unit of the first AIPD 103 to perform matrix multiplications using the matrix of weights and the input data. In some implementations, the computations to be performed are specified in the configuration data received by the first AIPD 103 and based on the specified computations, the controller of the first AIPD 103 transmits data to appropriate computation units of the AIPD 103, such as the computation unit 121 of the AIPD 103a.

The method 400 includes, at the first AIPD 103, transmitting the result from the computations at the first AIPD 103 to a second AIPD 103 (stage 410). The second AIPD 103 is associated with a different layer of the neural network than the first AIPD. The method 400 includes, at the second AIPD 103, performing computations related to the layer of the neural network associated with the second AIPD 103 using the result data received from the first AIPD 103 and any other neural network related data (stage 412). In some implementations, the controller of the AIPD 103 performing computations can retrieve additional data for computations, such as parameter weights data to use in AI computations, from memory of the host computing device.

In implementations where the neural network model being processed by the AIPU includes a feedback loop between two or more layers of the neural network and the second AIPD 103 and the first AIPD 103 are associated with the layers of the neural network between which the feedback loop is included, then the method 400 includes, at the second AIPD 103, transmitting result data from the computations at the second AIPD 103 as feedback to the first AIPD 103 (stage 414). If no feedback loop is present between the layers associated with the second AIPD 103 and the first AIPD 103, then the method 400 includes transmitting the result of the neural network from the AIPU to the main processing unit 101 (stage 416). The controller of the AIPD 103 associated with the output layer of the neural network will transmit the result of the neural network to the main processor 101 using the host-interface, such as the host-interface unit 113 of the AIPD 103a. For example, in FIG. 2A, the AIPD 103a is the AIPD 103 associated with the output layer of the neural network in FIG. 2A, thus, the AIPD controller 117 of the AIPD 103a transmits the result data to the main processor 101 using the host-interface unit 113. Similarly, in FIG. 2B, the AIPD 103f is associated with the output layer of the neural network in FIG. 2B, and the AIPD controller of the AIPD 103f transmits the result data to the main processor 101 using the host-interface unit of the AIPD 103f.

The method 400 includes, at the main processing unit 101, transmitting the neural network result received from the AIPU to the neural network task requestor (stage 418). The "neural network task requestor," as used herein, can be another process within the host computing device or an end user of the host computing device. While only two AIPDs 103 are described in FIG. 4 for the purpose of maintaining clarity and illustrating a clear example, the number of AIPDs 103 utilized in executing a neural network task depends at least in part on the volume of the neural network tasks expected to be performed by the host computing device.

Figure 5:
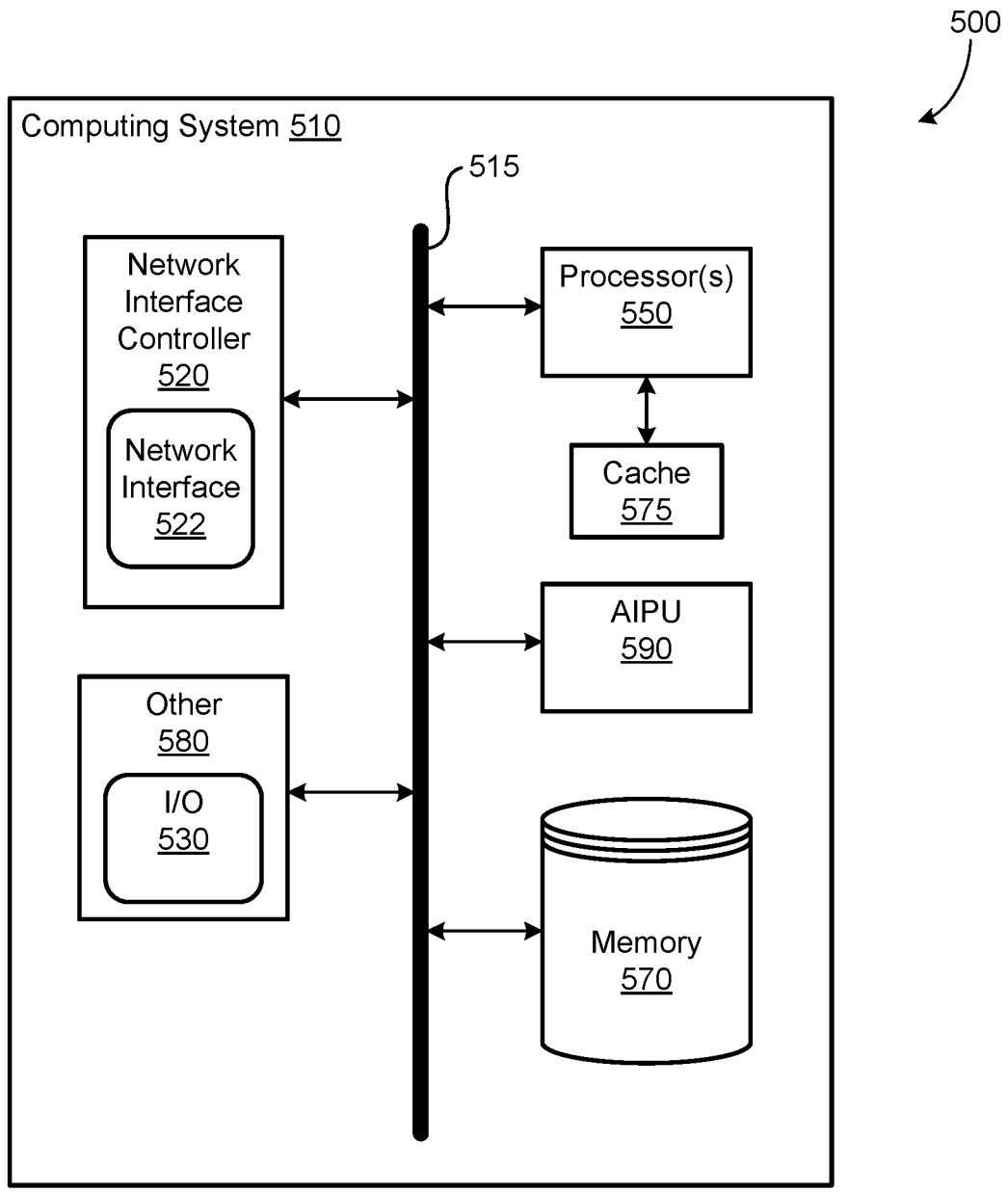
FIG. 5 is a block diagram illustrating a general architecture for a computer system that may be employed to implement elements of the systems and methods described and illustrated herein, according to an illustrative implementation.

FIG. 5 is a block diagram illustrating a general architecture for a computer system 500 that may be employed to implement elements of the systems and methods described and illustrated herein, according to an illustrative implementation. The computing system 500 can be used to implement the host computing device described above. The computing system 500 may be utilized in implementing the configuration of the AIPU method 300 and the processing neural network tasks using the AIPU method 400 shown in FIGS. 3 and 4.

In broad overview, the computing system 510 includes at least one processor 550 for performing actions in accordance with instructions and one or more memory devices 570 or 575 for storing instructions and data. The illustrated example computing system 510 includes one or more processors 550 in communication, via a bus 515, with at least one network interface controller 520 with one or more network interface ports 522 connecting to a network (not shown), AIPU 590, memory 570, and any other components 580, e.g., input/output (I/O) interface 530. Generally, a processor 550 will execute instructions received from memory. The processor 550 illustrated incorporates, or is directly connected to, cache memory 575.

In more detail, the processor 550 may be any logic circuitry that processes instructions, e.g., instructions fetched from the memory 570 or cache 575. In many embodiments, the processor 550 is a microprocessor unit or special purpose processor. The computing device 500 may be based on any processor, or set of processors, capable of operating as described herein. In some implementations, the processor 550 can be capable of executing certain stages of the method 300 shown in FIG. 3, such as stages 302, 304, 306, and certain stages of the method 400 shown in FIG. 4, such as stages 402, 404, 418. The processor 550 may be a single core or multi-core processor. The processor 550 may be multiple processors. In some implementations, the processor 550 can be configured to run multi-threaded operations. In some implementations, the processor 550 may host one or more virtual machines or containers, along with a hypervisor or container manager for managing the operation of the virtual machines or containers. In such implementations, the method 300 shown in FIG. 3 and the method 400 shown in FIG. 4 can be implemented within the virtualized or containerized environments provided on the processor 550.

The memory 570 may be any device suitable for storing computer readable data. The memory 570 may be a device with fixed storage or a device for reading removable storage media. Examples include all forms of non-volatile memory, media and memory devices, semiconductor memory devices (e.g., EPROM, EEPROM, SDRAM, and flash memory devices), magnetic disks, magneto optical disks, and optical discs (e.g., CD ROM, DVD-ROM, and Blu-ray® discs). A computing system 500 may have any number of memory devices 570. In some implementations, the memory 570 can include instructions corresponding to the method 300 shown in FIG. 3 and the method 400 shown in FIG. 4. In some implementations, the memory 570 supports virtualized or containerized memory accessible by virtual machine or container execution environments provided by the computing system 510.

The cache memory 575 is generally a form of computer memory placed in close proximity to the processor 550 for fast read times. In some implementations, the cache memory 575 is part of, or on the same chip as, the processor 550. In some implementations, there are multiple levels of cache 575, e.g., L2 and L3 cache layers.

The network interface controller 520 manages data exchanges via the network interfaces 522 (also referred to as network interface ports). The network interface controller 520 handles the physical and data link layers of the OSI model for network communication. In some implementations, some of the network interface controller's tasks are handled by the processor 550. In some implementations, the network interface controller 520 is part of the processor 550. In some implementations, a computing system 510 has multiple network interface controllers 520. The network interfaces 522 are connection points for physical network links. In some implementations, the network interface controller 520 supports wireless network connections and an interface port 522 is a wireless receiver/transmitter. Generally, a computing device 510 exchanges data with other computing devices via physical or wireless links to a network interfaces 522. The network interface 522 may link directly to another device or via an intermediary device, e.g., a network device, such as a hub, a bridge, a switch, or a router, connecting the computing device 510 to a network such as the Internet. In some implementations, the network interface controller 520 implements a network protocol such as Ethernet.

The other components 580 may include an I/O interface 530, external serial device ports, and any additional co-processors. For example, a computing system 510 may include an interface (e.g., a universal serial bus (USB) interface) for connecting input devices (e.g., a keyboard, microphone, mouse, or other pointing device), output devices (e.g., video display, speaker, or printer), or additional memory devices (e.g., portable flash drive or external media drive). In some implementations, the other components 580 include additional coprocessors, such as a math co-processor that can assist the processor 550 with high precision or complex calculations.

Implementations of the subject matter and the operations described in this specification can be implemented in digital electronic circuitry, or in computer software embodied on a tangible medium, firmware, or hardware, including the structures disclosed in this specification and their structural equivalents, or in combinations of one or more of them. Implementations of the subject matter described in this specification can be implemented as one or more computer programs embodied on a tangible medium, i.e., one or more modules of computer program instructions, encoded on one or more computer storage media for execution by, or to control the operation of, a data processing apparatus. A computer storage medium can be, or be included in, a computer-readable storage device, a computer-readable storage substrate, a random or serial access memory array or device, or a combination of one or more of them. The computer storage medium can also be, or be included in, one or more separate components or media (e.g., multiple CDs, disks, or other storage devices). The computer storage medium may be tangible and non-transitory.

The operations described in this specification can be implemented as operations performed by a data processing apparatus on data stored on one or more computer-readable storage devices or received from other sources. The operations may be executed within the native environment of the data processing apparatus or within one or more virtual machines or containers hosted by the data processing apparatus.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers or one or more virtual machines or containers that are located at one site or distributed across multiple sites and interconnected by a communication network. Examples of communication networks include a local area network ("LAN") and a wide area network ("WAN"), an inter-network (e.g., the Internet), and peer-to-peer networks (e.g., ad hoc peer-to-peer networks).

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. An integrated circuit configured to process workloads of a neural network comprising a plurality of neural network layers, the integrated circuit comprising:
a plurality of processing dies, each of the plurality of processing dies being configured to process a respective portion of the workload that corresponds to one or more layers of the neural network; and
a plurality of communication paths configured to couple each of the plurality of processing dies, such that a first processing die is able to pass an output of a neural network layer to a second, different processing die.

2. The integrated circuit of claim 1, comprising:
an artificial intelligence ("AI") processing unit that includes each of the plurality of processing dies,
wherein the AI processing unit is configured to perform, using each of the plurality of processing dies, computational tasks corresponding to the workload of the neural network based on configuration data generated at the integrated circuit.

3. The integrated circuit of claim 2, comprising:
a main controller external to each of the plurality of processing dies, wherein the main controller is configured to provide control signals to the AI processing unit to cause the plurality of processing dies to perform the computational tasks.

4. The integrated circuit of claim 3, comprising:
a main processing unit configured to:
generate the configuration data; and
select a particular processing die among the plurality of processing dies to process a respective portion of the workload of the neural network.

5. The integrated circuit of claim 4, wherein the main controller is included in the main processing unit and is used to select the particular processing die to process the respective portion of the workload of the neural network.

6. The integrated circuit of claim 1, wherein:
each of the plurality of processing dies are identical artificial intelligence processing dies that are communicatively coupled to one another by way of one or more communication paths of the plurality of communication paths.

7. The integrated circuit of claim 6, wherein:
each of the plurality of processing dies includes a respective inter-die input block that is coupled to a first corresponding communication path of the integrated circuit; and
each of the plurality of processing dies is configured to receive an input to a neural network layer via its respective inter-die input block and the first corresponding communication path of the integrated circuit.

8. The integrated circuit of claim 6, wherein:
each of the plurality of processing dies includes a respective inter-die output block that is coupled to a second corresponding communication path of the integrated circuit; and
each of the plurality of processing dies is configured to provide an output of a neural network layer via its respective inter-die output block and the second corresponding communication path of the integrated circuit.

9. The integrated circuit of claim 1, wherein each of the plurality of processing dies includes a respective controller that is configured to:

execute an instruction received via an inter-die input block of the processing unit that is coupled to a corresponding communication path of the integrated circuit.

10. The integrated circuit of claim 9, wherein the instruction is to perform a neural network tasks that represents one or more portions of the workload of the neural network.

11. A method performed using an integrated circuit that processes a workload of a neural network comprising a plurality of neural network layers, the method comprising:

processing, by a first processing die of a plurality of processing dies of the integrated circuit, a first portion of the workload that corresponds to a first neural network layer;

passing an output of the first neural network layer to a second processing die using a first path communication configured to couple the first and second processing dies; and processing, by the second processing die, a second portion of the workload that corresponds to a second neural network layer and the output of the first neural network layer.

12. The method of claim 11, wherein:

each of the plurality of processing dies is configured to process a respective portion of the workload that corresponds to one or more layers of the neural network; and the integrated circuit comprises a plurality of communication paths that are configured to couple each of the plurality of processing dies.

13. The method of claim 12, wherein the integrated circuit comprises an artificial intelligence ("AI") processing unit that includes each of the plurality of processing dies; and the method comprises:

performing, using each of the plurality of processing dies of the AI processing unit, computational tasks corresponding to the workload of the neural network based on configuration data generated at the integrated circuit.

14. The method of claim 13, comprising:

generating, by a main controller that is external to each of the plurality of processing dies, control signals used to perform the computational tasks; and providing, by the main controller, the control signals to the AI processing unit to cause the plurality of processing dies to perform the computational tasks.

15. The method of claim 14, wherein the integrated circuit comprises a main processing unit and the method comprises:

generating, by the main processing unit, the configuration data; and selecting, by the main processing unit, a particular processing die among the plurality of processing dies to process a respective portion of the workload of the neural network.

16. The method of claim 15, wherein the main controller is included in the main processing unit and the selecting the particular processing die comprises:

selecting, using the main controller, the particular processing die to process the respective portion of the workload of the neural network.

17. The method of claim 11, wherein:

each of the plurality of processing dies are identical artificial intelligence processing dies that are communicatively coupled to one another by way of one or more communication paths of the plurality of communication paths.

18. The method of claim 17, wherein:

each of the plurality of processing dies includes a respective inter-die input block that is coupled to a first corresponding communication path of the integrated circuit; and the method comprises, each of the plurality of processing dies receiving an input to a neural network layer via the respective inter-die input block of the processing and the first corresponding communication path of the integrated circuit.

19. The method of claim 17, wherein:

each of the plurality of processing dies includes a respective inter-die output block that is coupled to a second corresponding communication path of the integrated circuit; and the method comprises, each of the plurality of processing dies providing an output of a neural network layer via the respective inter-die output block of the processing die and the second corresponding communication path of the integrated circuit.

20. A non-transitory machine-readable storage device for storing instructions to process a workload of a neural network comprising a plurality of neural network layers, the instructions being executable by a processing device to perform operations comprising:

processing, by a first processing die of a plurality of processing dies of an integrated circuit, a first portion of the workload that corresponds to a first neural network layer;

passing an output of the first neural network layer to a second processing die using a first path communication path configured to couple the first and second processing dies; and processing, by the second processing die, a second portion of the workload that corresponds to a second neural network layer and the output of the first neural network layer.

* * * * *